(12) United States Patent
Manku et al.

(10) Patent No.: US 7,016,662 B1
(45) Date of Patent: Mar. 21, 2006

(54) METHOD AND APPARATUS FOR UP-CONVERSION OF RADIO FREQUENCY (RF) SIGNALS

(75) Inventors: Tajinder Manku, Waterloo (CA); Chris Snyder, Lunenburg (CA); Gareth Weale, New Hamburg (CA)

(73) Assignee: Sirific Wireless Corporation, Waterloo (CA)

( * ) Notice: Subject to any disclaimer, the term of this patent is extended or adjusted under 35 U.S.C. 154(b) by 295 days.

(21) Appl. No.: 10/070,013

(22) PCT Filed: Sep. 1, 2000

(86) PCT No.: PCT/CA00/00995

§ 371 (c)(1),
(2), (4) Date: Jul. 29, 2002

(87) PCT Pub. No.: WO01/17121

PCT Pub. Date: Mar. 8, 2001

(30) Foreign Application Priority Data

Sep. 1, 1999 (CA) .................................... 2281236

(51) Int. Cl.
*H04B 1/26* (2006.01)

(52) U.S. Cl. .................. 455/323; 455/189.1; 455/314; 455/296; 455/183.1

(58) Field of Classification Search ............ 455/114.2, 455/115.1, 126, 76, 183.1, 189.1, 190.1, 207, 455/208, 209, 296, 313, 315, 323
See application file for complete search history.

(56) References Cited

U.S. PATENT DOCUMENTS

| | | | |
|---|---|---|---|
| 4,110,834 A | 8/1978 | Altwein | |
| 4,193,034 A | 3/1980 | Vance | |
| 4,238,850 A | 12/1980 | Vance | |
| 4,254,503 A | 3/1981 | Vance | |
| 4,271,501 A | 6/1981 | Vance et al. | |
| 4,322,851 A | 3/1982 | Vance | |
| 4,462,107 A | 7/1984 | Vance | |
| 4,470,147 A | 9/1984 | Goatcher | |
| 4,476,585 A | 10/1984 | Reed | |
| 4,480,327 A | 10/1984 | Vance | |
| 4,488,064 A | 12/1984 | Vance | |
| 4,506,262 A | 3/1985 | Vance et al. | |
| 4,521,892 A | 6/1985 | Vance et al. | |
| 4,523,324 A | 6/1985 | Marshall | |
| 4,525,835 A | 6/1985 | Vance et al. | |

(Continued)

FOREIGN PATENT DOCUMENTS

CA 1226627 9/1987

(Continued)

OTHER PUBLICATIONS

Abidi "Direct-Conversion Radio Transceivers for Digital Communications," IEEE J. of Solid-State Circuits, 30:1399-1410 (1995).

(Continued)

*Primary Examiner*—Edward F. Urban
*Assistant Examiner*—Blane J. Jackson
(74) *Attorney, Agent, or Firm*—Townsend and Townsend and Crew LLP

(57) ABSTRACT

This patent describes a method and system which overcomes the LO-leakage problem of direct conversion and similar RF transmitters. To solve this problem a virtual LO™ signal is generated within the baseband which is tuned to the incoming RF signal. The virtual local oscillator (VLO) signal is constructed using signals that do not contain a significant amount of power (or no power at all) at the wanted output RF frequency. Any errors is generating the virtual LO signal are minimized using a closed loop correction scheme.

31 Claims, 10 Drawing Sheets

U.S. PATENT DOCUMENTS

| | | |
|---|---|---|
| 4,571,738 A | 2/1986 | Vance |
| 4,583,239 A | 4/1986 | Vance |
| 4,599,743 A | 7/1986 | Reed |
| 4,618,967 A | 10/1986 | Vance et al. |
| 4,677,690 A | 6/1987 | Reed |
| 4,726,042 A | 2/1988 | Vance |
| 4,736,390 A * | 4/1988 | Ward et al. .................. 375/316 |
| 4,811,425 A | 3/1989 | Feerst |
| 4,955,039 A | 9/1990 | Rother et al. |
| 5,128,623 A | 7/1992 | Gilmore |
| 5,179,728 A | 1/1993 | Sowadski |
| 5,220,688 A | 6/1993 | Tao |
| 5,228,042 A | 7/1993 | Gauthier et al. |
| 5,303,417 A | 4/1994 | Laws |
| 5,361,408 A | 11/1994 | Watanabe et al. |
| 5,390,346 A | 2/1995 | Marz |
| 5,416,803 A | 5/1995 | Janer |
| 5,422,889 A * | 6/1995 | Sevenhans et al. .......... 370/442 |
| 5,448,772 A * | 9/1995 | Grandfield .................. 455/333 |
| 5,451,899 A | 9/1995 | Lawton |
| 5,467,294 A | 11/1995 | Hu et al. |
| 5,471,665 A * | 11/1995 | Pace et al. ............... 455/343.2 |
| 5,530,929 A | 6/1996 | Lindqvist et al. |
| 5,715,530 A | 2/1998 | Eul |
| 5,838,717 A | 11/1998 | Ishii et al. |
| 5,896,421 A * | 4/1999 | Zamat et al. ............... 375/296 |
| 5,918,167 A | 6/1999 | Tiller et al. |
| 5,918,169 A | 6/1999 | Dent |
| 5,949,830 A | 9/1999 | Nakanishi |
| 5,953,643 A | 9/1999 | Speake et al. |
| 6,002,923 A | 12/1999 | Sahlman |
| 6,014,408 A | 1/2000 | Naruse et al. |
| 6,016,422 A * | 1/2000 | Bartusiak ...................... 455/76 |
| 6,029,058 A | 2/2000 | Namgoog et al. |
| 6,049,706 A | 4/2000 | Cook et al. |
| 6,061,551 A | 5/2000 | Sorrells et al. |
| 6,073,000 A | 6/2000 | Shinohara |
| 6,091,940 A | 7/2000 | Sorrells et al. |
| 6,125,272 A | 9/2000 | Bautista |
| 6,148,184 A | 11/2000 | Manku et al. |
| 6,167,247 A | 12/2000 | Kannel |
| 6,194,947 B1 | 2/2001 | Lee et al. |
| 6,225,848 B1 * | 5/2001 | Tilley et al. ................. 327/307 |
| 6,243,569 B1 | 6/2001 | Atkinson |
| 6,308,058 B1 | 10/2001 | Souetinov et al. |
| 6,324,388 B1 | 11/2001 | Souetinov |
| 2001/0014596 A1 | 8/2001 | Takaki et al. |

FOREIGN PATENT DOCUMENTS

| | | |
|---|---|---|
| CA | 1290403 | 10/1991 |
| CA | 2243757 A1 | 2/1999 |
| CA | 2245958 | 2/1999 |
| CA | 2305134 A1 | 4/1999 |
| CA | 2224953 | 6/1999 |
| CA | 2316969 A1 | 7/1999 |
| CA | 2270337 | 10/1999 |
| CA | 2272877 | 11/1999 |
| CA | 2281236 A1 | 3/2001 |
| CA | 2339744 A1 | 3/2001 |
| CA | 2331228 A1 | 7/2001 |
| CA | 2300045 A1 | 9/2001 |
| CA | 2273671 | 3/2002 |
| EP | 0634855 A1 | 1/1995 |
| EP | 0721270 A1 | 7/1996 |
| EP | 0782249 A1 | 7/1997 |
| EP | 837565 A | 4/1998 |
| EP | 0899868 AI | 3/1999 |
| EP | 902549 A | 3/1999 |
| EP | 1085665 A2 | 3/1999 |
| EP | 977351 A | 2/2000 |
| EP | 0993125 A2 | 4/2000 |
| EP | 1067689 A2 | 1/2001 |
| EP | 1085652 A2 | 3/2001 |
| GB | 2329085 A | 3/1999 |
| GB | 2331207 A | 5/1999 |
| WO | WO 96/01006 A | 1/1996 |
| WO | WO 96/01006 A1 | 1/1996 |
| WO | WO 97/50202 A2 | 12/1997 |
| WO | WO 99/55000 A2 | 10/1999 |
| WO | WO 99/55015 A1 | 10/1999 |
| WO | WO 00/05815 A1 | 2/2000 |
| WO | WO 00/69085 A1 | 11/2000 |

OTHER PUBLICATIONS

Anvari et al. "Peformance of a Direct Conversion Receiver with π/4-DPSK Modulated Signal," IEEE publication Ch2944-7/91/0000/0822, pp. 822-827 (1991).

Cho et al. "A Single Chip CMOS Direct-Conversion Transceiver For 900MHz Spread-Spectrum Digital Cordless Phones," IEEE 1999 International Solid-State Circuits Conference paper TP13.5 (1999).

Enz "Design of Low-Power and Low-Voltage Analog and RF Integrated Circuits in Ultra Deep Submicron CMOS Technologies," available from the Electronics Laboratory of EPFL (Lausanne) website http://legwww.epfl.ch (2001).

GCT Semiconductor, Inc. "GCT's Direct Conversion Technology," product information available from http://www.gct21.com (2002).

Heinen et al. "A 2.7V 2.5GHz Bipolar Chipset for Digital Wireless Communication," IEEE 1997 International Solid-State Circuits Conference, paper SA 18.4 (1997).

Marshall et al. A 2.7GHz GSM Transceiver ICs with On-Chip Filtering, IEEE 1995 International Solid-State Circuits Conference, paper TA 8.7 (1995).

McDonald "A 2.5GHz BiCMOS Image-Reject Front-End," 1993 International Solid-State Circuits Conference, paper TP 9.4 (1993).

Razavi "Design Considerations for Direct-Conversion Receivers," IEEE Transactions on Circuits and Systems—II: Analog and Digital Signal Prcessing 44:428-435 (1997).

Rudell et al. "A 1.9GHz Wide-Band IF Double Conversion CMOS Integrated Receiver for Cordless Telephone Applications," IEEE 1997 International Solid-State Circuits Conference, paper SA 18.3 (1997).

Sanduleanu et al. "Chopping: a technique for noise and offset reduction," *Power, Accuracy and Noise Aspects in CMOS Mixed-Signal Design*, chapter 5, sections 5.2 and 5.4, EDA Books Online http://www.dacafe.com (1999).

Sanduleanu et al. "Low-Power Low-Voltage Chopped Transconductance Amplifier for Noise and Offset Reduction," conference paper, 23rd European Solid-State Circuits Conference Southampton, UK, Sep. 16-18, 1997.

Sevenhans et al. "An integrated Si bipolar RF transceiver for zero if 900 MHz GSM digital mobile radio frontend of a hand portable phone," Proceedings of the Custom ICConference, San Diego 1991; IEEE publication 0-7803-0768-2, pp561-564 (1992).

Stetzler et al. "A 2.7V to 4.5 V Single-Chip GSM Transceiver RF Integrated Circuit," 1995 International Solid-State Circuits Conference, paper TA 8.8 (1995).

Aue et al. "Multicarrier spread spectrum modulation with reduce dynamic range," IEEE Vehicular Technology Conference Atlanta, vol. 2, pp. 914-917 (1996).

* cited by examiner

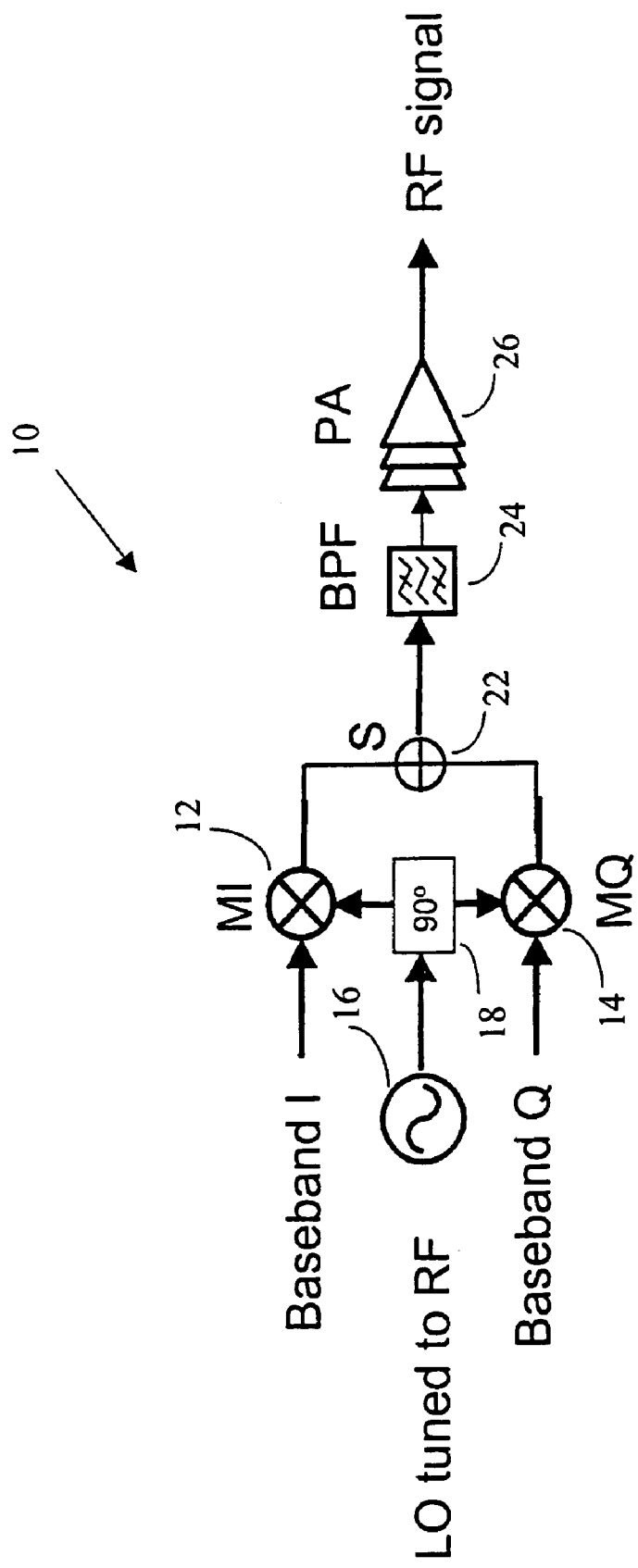
FIGURE 1 - PRIOR ART

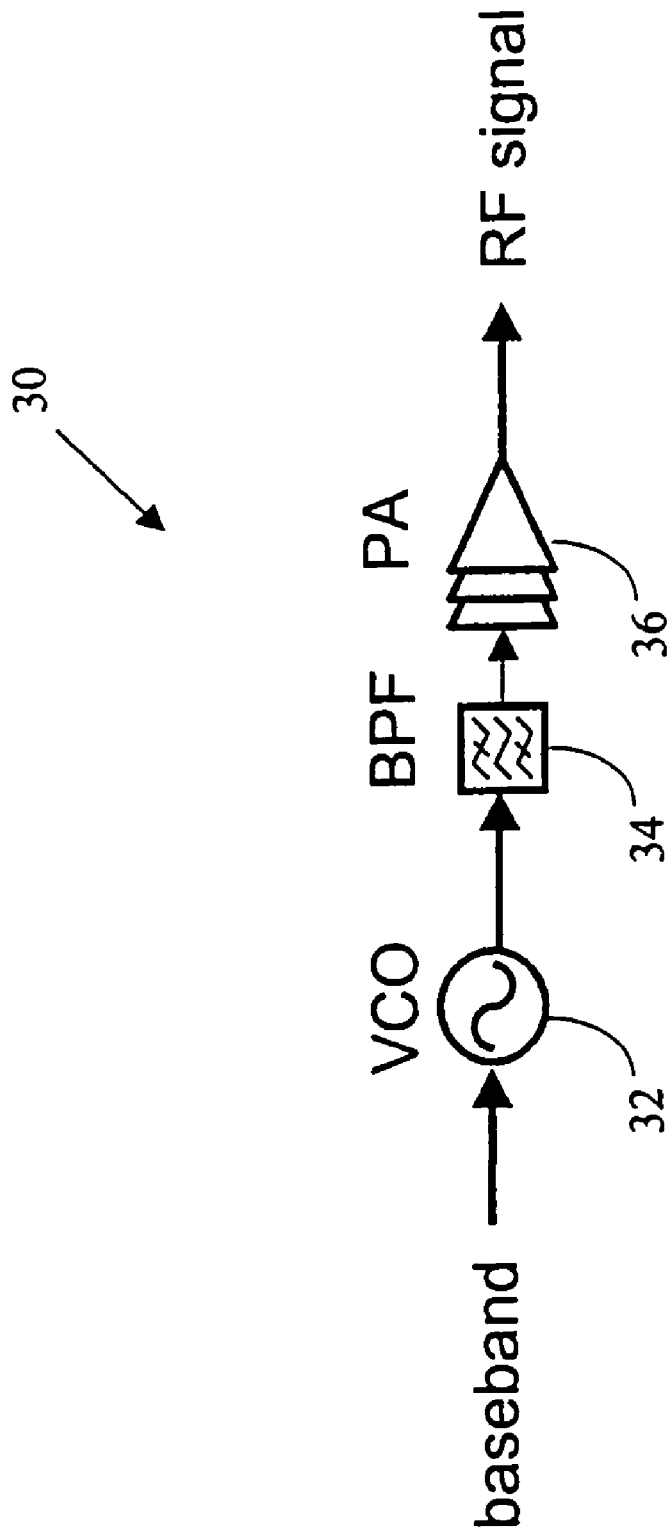
FIGURE 2 - PRIOR ART

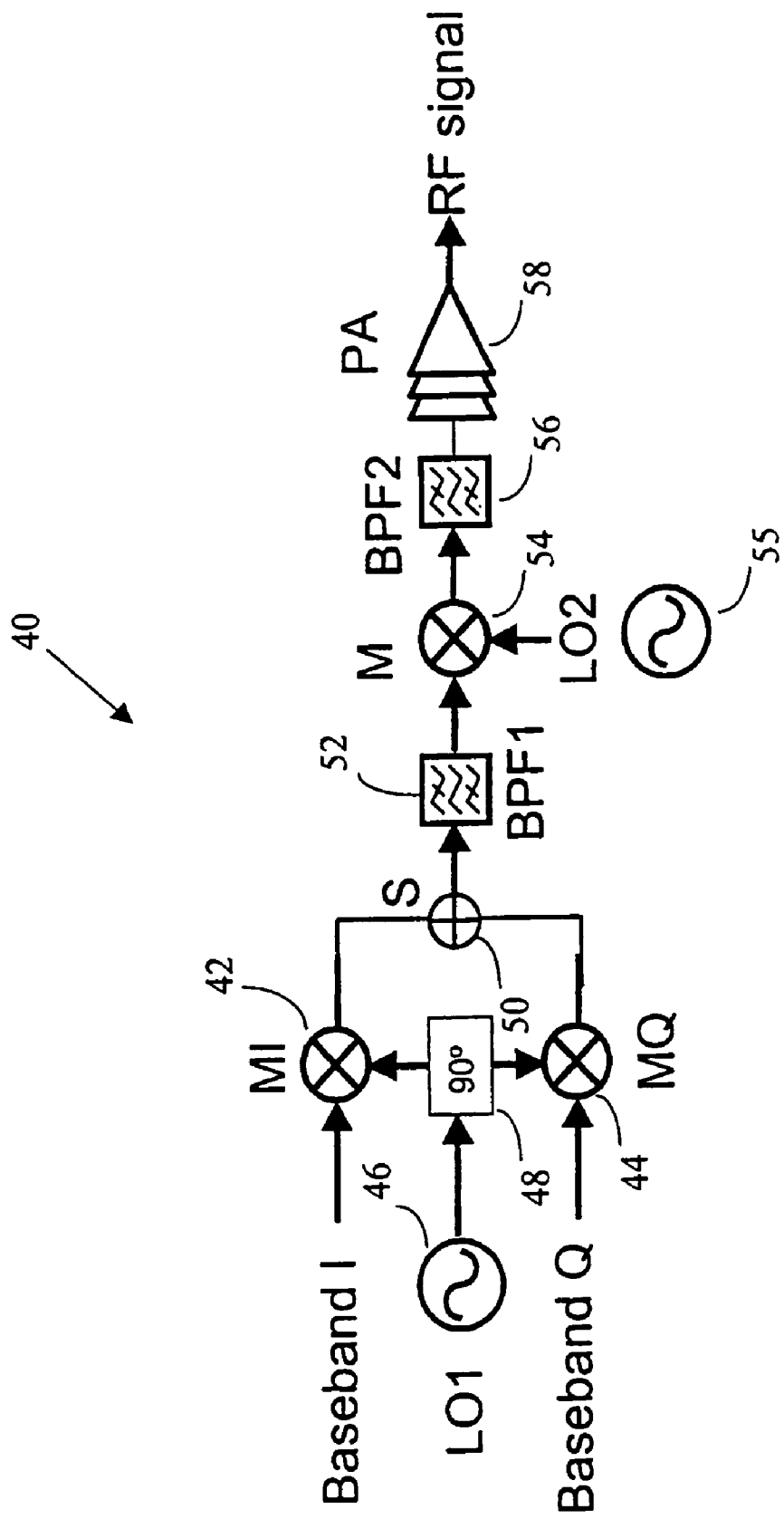
FIGURE 3 - PRIOR ART

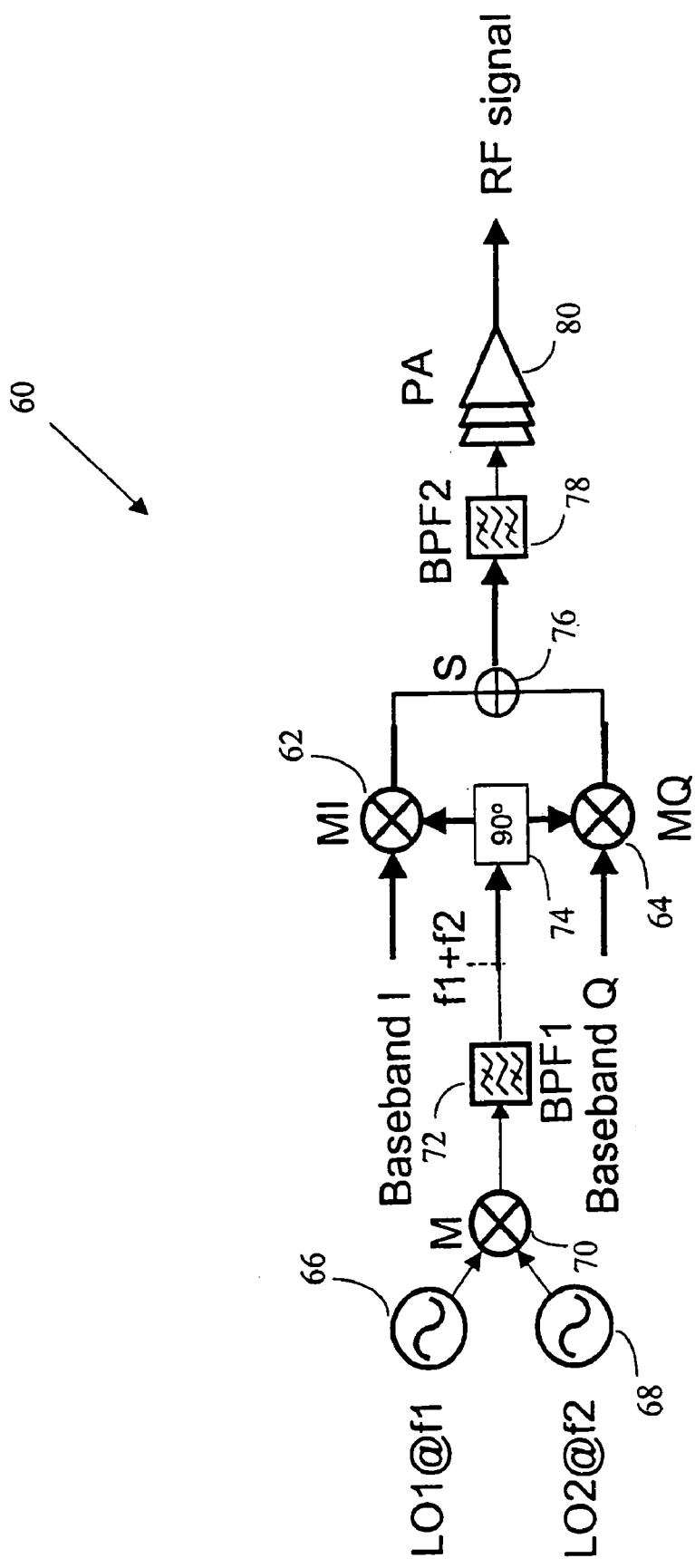
FIGURE 4 - PRIOR ART

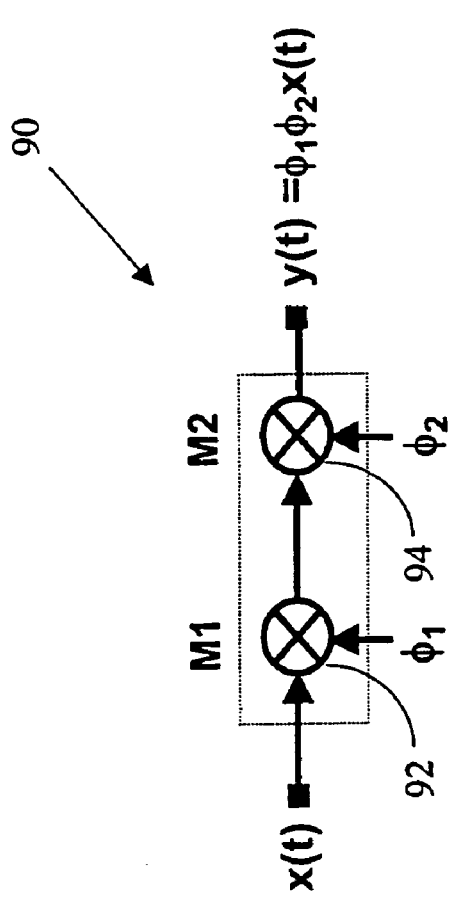
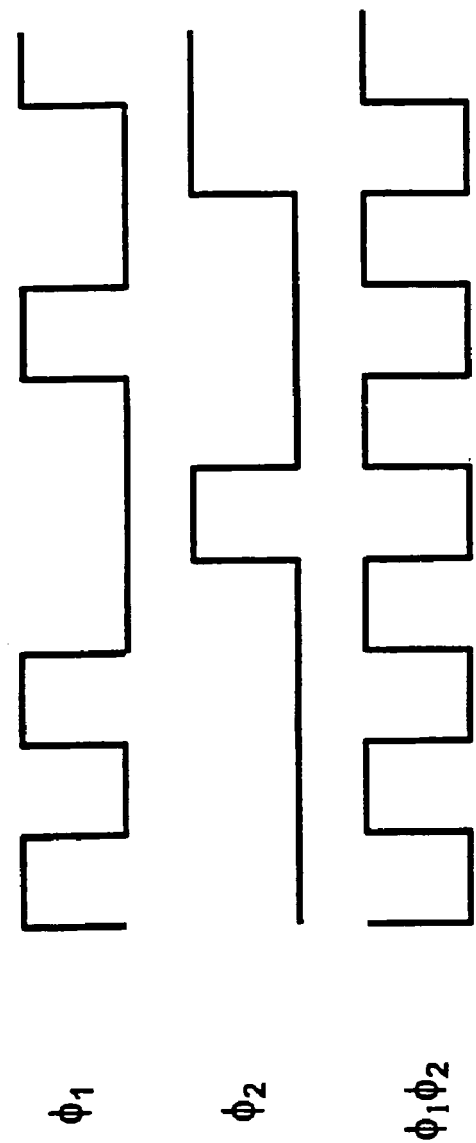
FIGURE 5(a)
FIGURE 5(b)

METHOD AND APPARATUS FOR UP-CONVERSION OF RADIO FREQUENCY (RF) SIGNALS

The present invention relates generally to communications, and more specifically, to a fully-integrable method and apparatus for up-conversion of radio frequency (RF) and baseband signals with reduced local oscillator (LO) leakage.

BACKGROUND OF THE INVENTION

Many communication systems modulate electromagnetic signals from baseband to higher frequencies for transmission, and subsequently demodulate those high frequencies back to their original frequency band when they reach the receiver. The original (or baseband) signal, may be, for example: data, voice or video. These baseband signals may be produced by transducers such as microphones or video cameras, be computer generated, or transferred from an electronic storage device. In general, the high transmission frequencies provide longer range and higher capacity channels than baseband signals, and because high frequency RF signals can propagate through the air, they can be used for wireless channels as well as hard wired or fibre channels.

All of these signals are generally referred to as radio frequency (RF) signals, which are electromagnetic signals, that is, waveforms with electrical and magnetic properties within the electromagnetic spectrum normally associated with radio wave propagation. The electromagnetic spectrum was traditionally divided into 26 alphabetically designated bands, however, the ITU formally recognizes 12 bands, from 30 Hz to 3000 GHz. New bands, from 3 THz to 3000 THz, are under active consideration for recognition.

Wired communication systems which employ such modulation and demodulation techniques include computer communication systems such as local area networks (LANs), point to point signalling, and wide area networks (WANs) such as the Internet. These networks generally communication data signals over electrical or optical fibre chanels. Wireless communication systems which may employ modulation and demodulation include those for public broadcasting such as AM and FM radio, and UHF and VHF television. Private communication systems may include cellular telephone networks, personal paging devices, HF radio systems used by taxi services, microwave backbone networks, interconnected appliances under the Bluetooth standard, and satellite communications. Other wired and wireless systems which use RF modulation and demodulation would be known to those skilled in the art.

One of the current problems in the art, is to develop physically small and inexpensive modulation techniques and devices that have good performance characteristics. For cellular telephones, for example, it is desirable to have a transmitter which can be fully integrated onto an integrated circuit.

Several attempts have been made at completely integrating communication transmitter designs, but have met with limited degrees of success. Existing solutions and their associated problems and limitations are summarized below:

1. Direct Conversion Transmitter

Direct conversion architectures 10 modulate baseband signals to RF levels in a single step by mixing a baseband signal with a local oscillator signal at the carrier frequency. Referring to the block diagram of FIG. 1, the in-phase (I) and quadrature (Q) components of the baseband signal are up-converted to RF via mixers MI 12 and MQ 14, respectively. The RF mixing signals are generated using a local oscillator 16 tuned to the RF, and a 90 degree phase shifter 18 which ensures that the I and Q signals are up-converted into their quadrature components. The two up-converted RF signals are added together via the summing element S 20, and filtered via a band pass filter (BPF) 22 having a pass band response around the RF signal to remove unwanted components. Finally, a power amplifier (PA) 26 amplifies the signal to the necessary transmission level.

Generally, a mixer is a circuit or device that accepts as its input two different frequencies and presents at its output:
  (a) a signal equal in frequency to the sum of the frequencies of the input signals;
  (b) a signal equal in frequency to the difference between the frequencies of the input signals; and
  (c) the original input frequencies.

The typical embodiment of a mixer is a digital switch, which may generate significantly more tones than those shown above.

Hence, the disadvantages of this topology are:
  the LO signal leaks into the RF signal, since the RF output signal is at the same frequency as the LO signal; and
  the output RF signal leaks back into the LO generation elements, causing it to detune. This mechanism is commonly referred to "LO pulling".

However, this topology can easily be integrated and requires fewer components than other modulation topologies known in the art.

2. Directly Modulated Transmitter

FIG. 2 presents a block diagram of a directly modulated transmitter 30 in which the baseband signal modulates a voltage control oscillator (VCO) 32, designed to oscillate within the vicinity of the RF frequency. The output of the VCO 32 is then filtered by a bandpass filter (BPF) 34 which has a pass band around the RF frequency to remove unwanted components. A power amplifier 36 then amplifies the filtered signal to the amplitude required.

The disadvantages of this topology are:
  the LO signal leaking into the RF signal; and
  the output RF signal leaking back into the LO generation element, causing it to detune. Again, this mechanism is commonly referred to "LO pulling".

This topology can easily be integrated and requires a small number of components. To maintain stability, the VCO 32 is locked via a phase lock loop in most applications. In some applications, the input to the VCO 32 could be an up-converted version of the baseband signal.

3. Dual Conversion Transmitter

A dual conversion topology solves two of the problems associated with the direct conversion and the direct modulation topologies, specifically, the LO signal leaking into the RF signal and "LO pulling". In this topology the baseband signal is translated to the RF band via two frequency translations, which are associated with two local oscillators (LOs), neither of which is tuned to the RF signal. Because neither of these LOs are tuned to the desired RF output frequency, the LO leakage problem and "LO pulling" problem are generally eliminated.

The dual conversion topology is presented as a block diagram in FIG. 3. Like the direct conversion transmitter described with respect to FIG. 1 hereinabove, the in-phase (I) and quadrature (Q) components of the base-band signal are first up-converted to RF via the mixers MI 42 and MQ 44, respectively. However, in this case, the RF mixing signal generated using local oscillator 46 is not tuned to the desired output frequency, but is tuned to an intermediate frequency (IF). The 90 degree phase shifter 48 then ensures that the I and Q signals are up-converted into their quadrature IF components. The two-upconverted IF signals are then added together via the summing element S 50, and filtered via a band pass filter (BPF) 52 having a pass band response around the IF signal.

The IF signal is then up-converted to the desired RF output frequency via mixer M 54 and a second local oscillator (LO2) 55, which need not be at the RF output frequency. The signal is then filtered via a second band pass filter (BPF) 56 having a pass band around the RF signal, and is amplified to the desired level using power amplifier (PA) 26.

Though this technique addresses the problems with the direct conversion and the direct modulation topologies, it has disadvantages of its own:
- it requires two LO signals;
- it requires two filters;
- it requires a significant amount of frequency planning; and
- it is difficult to integrate all the components into an integrated circuit.

4. Offset Conversion Transmitter

An offset conversion topology 60 such as that presented in FIG. 4, also solves the two main problems associated with direct conversion and direct modulation, that is, the LO signal leaking into the RF signal and "LO pulling". Like the dual conversion transmitter, this is done by translating the baseband signal to the RF band using two local oscillators, neither of which are tuned to the RF output frequency. As noted above, the LO leakage problem and "LO pulling" problem are avoided, because neither of these LOs are tuned to the RF output frequency.

Referring to the block diagram of FIG. 4, the baseband signal is up-converted to the RF frequency via mixers MI 62 and MQ 64 which are modulated by a combined signal from two separate oscillators LO1 66 and LO2 68. The frequency used to up-convert the base band signal is equal to f1+f2 where f1 is the fundamental frequency component of the local oscillator LO1 66 signal and f2 is the fundamental component of the local oscillator LO2 68 signal. Mixing the signals from oscillators LO1 66 and LO2 68 via the mixer M 70 generates the frequency f1+f2, which corresponds to the RF output frequency. A band pass filter (BPF) 72 is then used to attenuate all frequency components except f1+f2. The 90 degree phase shifter 74 ensures the I and Q signals are up-converted into their quadrature components.

The two-upconverted signals are then added together via the summing element S 76, and filtered via a band pass filter (BPF) 78 having a pass band around the RF signal. Finally, a power amplifier 80 amplifies the signal to the desired level.

The disadvantages of this topology are:
- it requires two LO signals;
- it requires two filters; and
- it requires a significant amount of frequency planning.

There is therefore a need for a method and apparatus of modulating RF signals which allows the desired integrability along with good performance.

SUMMARY OF THE INVENTION

It is therefore an object of the invention to provide a novel method and system of modulation which obviates or mitigates at least one of the disadvantages of the prior art.

One aspect of the invention is broadly defined as a radio frequency (RF) up-convertor with reduced local oscillator leakage, for modulating an input signal x(t), comprising: a synthesizer for generating time-varying signals $\phi_1$ and $\phi_2$, where $\phi_1 * \phi_2$ has significant power at the frequency of a local oscillator signal being emulated, and neither $\phi_1$ nor $\phi_2$ has significant power at the frequency of the local oscillator signal being emulated; a first mixer coupled to the synthesizer for mixing the input signal x(t) with the time-varying signal $\phi_1$ to generate an output signal x(t) $\phi_1$; and a second mixer coupled to the synthesizer and to the output of the first mixer for mixing the signal x(t) $\phi_1$ with the time-varying signal $\phi_2$ to generate an output signal x(t) $\phi_1 \phi_2$.

BRIEF DESCRIPTION OF THE DRAWINGS

These and other features of the invention will become more apparent from the following description in which reference is made to the appended drawings in which:

FIG. 1 presents a block diagram of a direct conversion transmitter as known in the art;

FIG. 2 presents a block diagram of a directly modulated transmitter as known in the art;

FIG. 3 presents a block diagram of a dual conversion transmitter as known in the art;

FIG. 4 presents a block diagram of offset conversion transmitter as known in the art;

FIG. 5(*a*) present a block diagram of a broad implementation of the invention;

FIG. 5(*b*) presents exemplary mixer input signals functions $\phi_1$ and $\phi_2$ plotted in amplitude against time;

DETAILED DESCRIPTION OF PREFERRED EMBODIMENTS OF THE INVENTION

Figure 6:
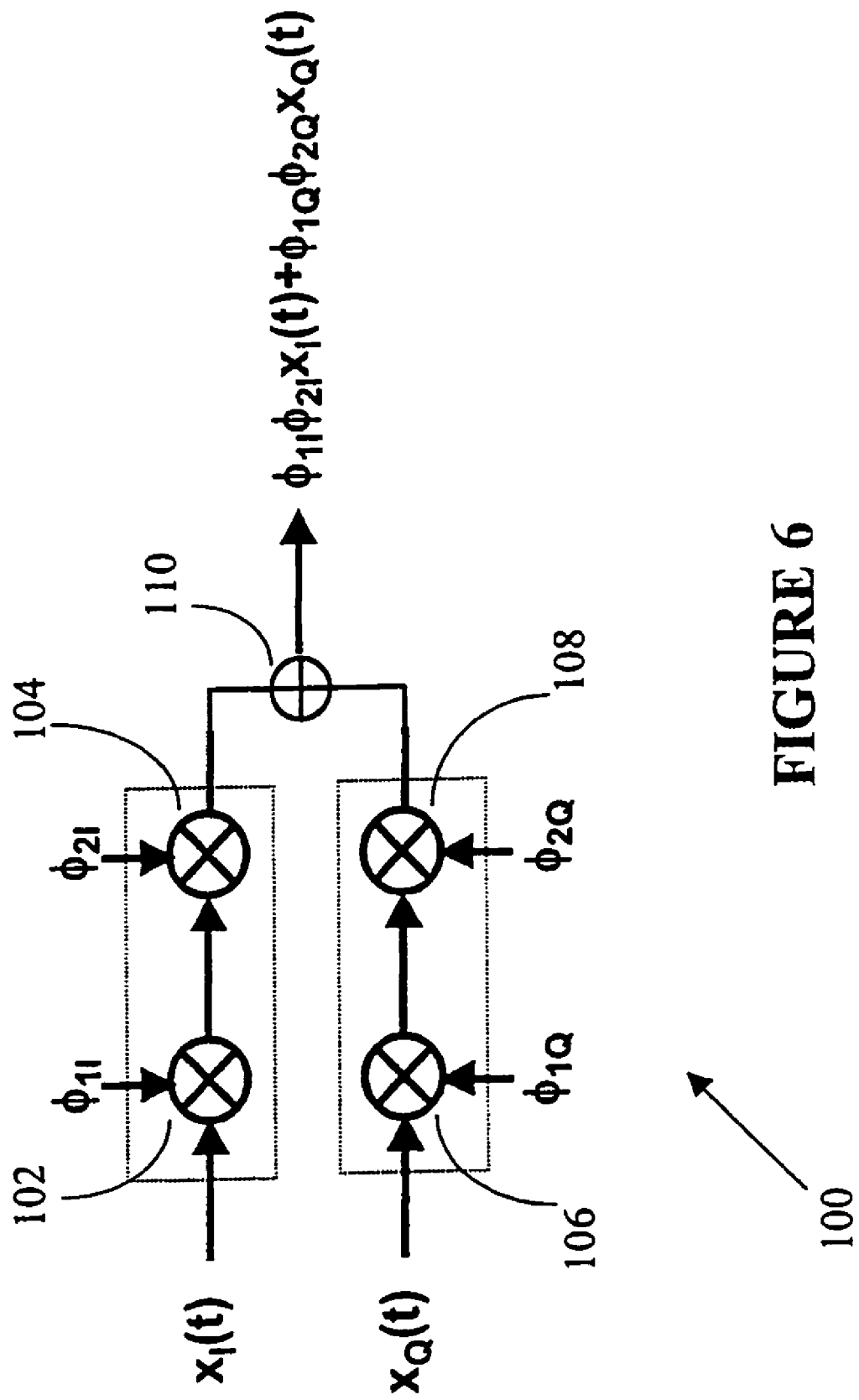
FIG. 6 presents a block diagram of quadrature modulation in an embodiment of the invention.

A device which addresses the objects outlined above, is presented as a block diagram in FIG. 5(*a*). This figure presents a modulator topography 90 in which an input signal x(t) is mixed with signals which are irregular in the time domain (TD), which effect the desired modulation. A virtual local oscillator (VLO) is generated by multiplying two functions (labelled $\phi_1$ and $\phi_2$) within the signal path of the input signal x(t) using two mixers M1 92 and M2 94. The mixers described within this invention would have the typical properties of mixers within the art, that is, they would have an associated noise figure, linearity response, and conversion gain. The selection and design of these mixers would follow the standards known in the art, and could be, for example, double balanced mixers. Though this figure implies various elements are implemented in analogue form they can be implemented in digital form.

The two time-varying functions $\phi_1$ and $\phi_2$ that comprise the virtual local oscillator (VLO) signal have the property that their product emulates a local oscillator (LO) signal that has significant power at the carrier frequency, but neither of the two signals has a significant level of power at the frequency of the local oscillator being emulated. As a result, the desired modulation is affected, but there is no LO signal to leak in the RF path. FIG. 5b depicts possible functions for $\phi_1$ and $\phi_2$.

To minimize the leakage of LO power into the RF output signal, as in the case of direct conversion and directly modulated topologies, the preferred criteria for selecting the functions $\phi_1$ and $\phi_2$ are:

(i) that $\phi_1$ and $\phi_2$ do not have any significant amount of power at the output frequency. That is, the amount of power generated at the output frequency should not effect the overall system performance of the transmitter in a significant manner;

(ii) the signals required to generate $\phi_1$ and $\phi_2$ should not have a significant amount of power at the output frequency; and (iii) if x(t) is a baseband signal, $\phi_1 * \phi_1 * \phi_2$ and $\phi_2 * \phi_2$ should not have a significant amount of power within the bandwidth of the up-converted RF (output) signal.

Conditions (i) and (ii) ensure an insignificant amount of power is generated within the system at the frequencies which would cause an equivalent LO leakage problem found in conventional direct conversion and directly modulated topologies. Condition (iii) ensures that if $\phi_1$ leaks into the input port, it does not produce a signal within the RF signal at the output. Condition (iii) also ensures that if $\phi_2$ leaks into node between the two mixers, it does not produce a signal within the RF signal at the output.

Various functions can satisfy the conditions provided above, several of which are described hereinafter, however it would be clear to one skilled in the art that other similar pairs of signals may also be generated. These signals can in general be random, pseudo-random, periodic functions of time, or digital waveforms. While these signals may be described as "aperiodic", groups or cycles may be repeated successively. For example, the $\phi_1$ and $\phi_2$ signals presented in FIG. 5(b) which generate the five-cycle $\phi_1 * \phi_2$ signal, may be input to mixers M1 92 and M2 94 repeatedly.

As well, rather than employing two mixing signals shown above, sets of three or more signals may be used (additional description of this is given hereinafter with respect to FIG. 10).

It would also be clear to one skilled in the art that virtual LO signals may be generated which provide the benefits of the invention to greater or lesser degrees. While it is possible in certain circumstances to have almost no LO leakage, it may be acceptable in other circumstances to incorporate apply virtual LO signals which still allow a degree of LO leakage.

The topology of the invention is similar to that of direct up-conversion, but provides a fundamental advantage: minimal leakage of a local oscillator (LO) signal into the RF band. The topology also provides technical advantages over other known topologies such as directly modulated, dual conversion and offset conversion transmitters:

removes the necessity of having a second LO and various (often external) filters; and has a higher level of integration as the components it does require are easily placed on an integrated circuit.

While the basic implementation of the invention may produce errors in generating the virtual local oscillator (VLO), solutions to this problem are available and are described hereinafter.

The invention provides the basis for a fully integrated communications transmitter. Increasing levels of integration have been the driving impetus towards lower cost, higher volume, higher reliability and lower power consumer electronics since the inception of the integrated circuit. This invention will enable communications transmitters to follow the same integration route that other consumer electronic products have benefited from.

Specifically, advantages from the perspective of the manufacturers when incorporating the invention into a product include:

1. significant cost savings due to the decreased parts count of an integral device. Decreasing the parts count reduces the cost of inventory control, reduces the costs associated with warehousing components, and reduces the amount of manpower to deal with higher part counts;
2. significant cost savings due to the decreased manufacturing complexity. Reducing the complexity reduces time to market, cost of equipment to manufacture the product, cost of testing and correcting defects, and reduces time delays due to errors and problems on the assembly line;
3. reduces design costs due to the simplified architecture. The simplified architecture will shorten the first-pass design time and total design cycle time as a simplified design will reduce the number of design iterations required;
4. significant space savings and increased manufacturability due to the high integrability and resulting reduction in product form factor (physical size). This implies huge savings throughout the manufacturing process as smaller device footprints enable manufacturing of products with less material such as printed circuit substrate, smaller product casing and smaller final product packaging;
5. simplification and integrability of the invention will yield products with higher reliability, greater yield, less complexity, higher life span and greater robustness;
6. due to the aforementioned cost savings, the invention will enable the creation of products that would otherwise be economically unfeasible;

Hence, the invention provides the manufacturer with a significant competitive advantage.

From the perspective of the consumer, the marketable advantages of the invention include:

1. lower cost products, due to the lower cost of manufacturing;
2. higher reliability as higher integration levels and lower parts counts imply products will be less prone to damage from shock, vibration and mechanical stress;
3. higher integration levels and lower parts counts imply longer product life span;
4. lower power requirements and therefore lower operating costs;
5. higher integration levels and lower parts counts imply lighter weight products;
6. higher integration levels and lower parts counts imply physically smaller products; and
7. the creation of economical new products.

The present invention relates to the translation of a baseband signal directly to an RF signal and is particular concerned with solving the LO-leakage problem associated with the present art. The invention allows one to fully integrate a RF transmitter on a single chip without using external filters, while furthermore, the RF transmitter can be used as a multi-standard transmitter. Descriptions of exemplary embodiments follow.

In many modulation schemes, it is necessary to modulate both I and Q components of the input signal, which requires a modulator 100 as presented in the block diagram of FIG. 6. In this case, four modulation functions would have to be generated: $\phi_{1I}*\phi_{2I}$ which is 90 degrees out of phase with $\phi_{1Q}*\phi_{2Q}$. The pairing of signals $\phi_{1I}$ and $\phi_{2I}$ must meet the function selection criteria listed above, as must the signal pairing of $\phi_{1Q}$ and $\phi_{2Q}$. The mixers 102, 104, 106, 108 are standard mixers as known in the art.

As shown in FIG. 6, mixer 102 receives the input signal x(t) and modulates it with $\phi_{1I}$; subsequent to this, mixer 104 modulates signal x(t) $\phi_{1I}$ with $\phi_{2I}$ to yield the in-phase component of the input signal at baseband, that is, x(t) $\phi_{1I}\phi_{2I}$. A complementary process occurs on the quadrature side of the modulator, where mixer 106 receives the input signal x(t) and modulates it with $\phi_{1Q}$; after which mixer 108 modulates signal x(t) $\phi_{1Q}$ with $\phi_{2Q}$ to yield the quadrature phase component of the input signal at baseband, that is, x(t) $\phi_{1Q}\phi_{2Q}$. The in-phase and quadrature components of the up-converted signal are then combined using summer 110 to yield the output signal: $x(t)\phi_{1I}\phi_{2I}+x(t)\phi_{1Q}\phi_{2Q}$.

In the analysis above timing errors that would arise when constructing the VLO have been neglected (timing errors can be in the form of a delay or a mismatch in rise/fall times). In the analysis which follows, only delays are considered, but the same analysis can be applied to rise/fall times. The actual VLO that is generated can be written as:

$$VLO_a = VLO_i + \epsilon_{VLO}(t) \quad (1)$$

where $VLO_n$ is the actual VLO generated, $VLO_i$ is the ideal VLO without any timing error, and $\epsilon_{VLO}(t)$ absorbs the error due to timing errors. Therefore, the output signal of the virtual LO topology, denoted as y(t), becomes:

$$y(t) = x(t) \times [VLO_i + \epsilon_{VLO}(t)] \quad (2)$$

The term x(t) VLOi is the wanted term and x(t) $\epsilon_{VLO}(t)$ is a term that could produce aliasing power into the wanted RF signal at the output of the structure. The term $\epsilon_{VLO}(t)$ can also be thought of a term that raises the noise floor of the VLO. This is not that serious a problem because the signal x(t) is at baseband and has a well defined bandwidth. By selecting $\phi_1$ and $\phi_2$ carefully and by placing an appropriate filter at the input of the structure, the amount of aliasing power can be reduced significantly, though it can never be completely eliminated due to timing errors.

There are several ways one could further reduce the amount of aliasing power, for example, by using a closed loop configuration as described below. The term x(t) $\epsilon_{VLO}(t)$ contains two terms at the RF output:

(i) aliasing power $P_a$, and
(ii) power of the wanted signal, but at a reduced power level which is on the order of delay error $P_{w\epsilon}$.

Therefore, the total power at the RF output (denoted by $P_M$) can be decomposed into three components:

(i) the power of the wanted RF signal $P_w$,
(ii) the power of the aliasing terms, $P_a$, and
(iii) the power of the wanted RF signal arising from the term, $P_{w\epsilon}$ (this power can either be positive or negative). Therefore, $$P_M = P_w + P_{w\epsilon}(\tau) + P_a(\tau) \quad (3)$$

Note that $P_{w\epsilon}$ and $P_a$ are a function of the delay $\tau$. Since $|P_w| >> |P_{w\epsilon}|$, (3) becomes, $$P_M = P_w + P_a(\tau) \quad (4)$$

If the power, $P_M$ is measured and $\tau$ is adjusted in time, one can reduce the term Pa to zero (or close to zero). Mathematically this can be done if the slope of $P_M$ with the delay $\tau$ is set to zero; that is:

$$\frac{dP_M}{d\tau} = \frac{dP_a(\tau)}{d\tau} = 0 \quad (5)$$

Figure 7:
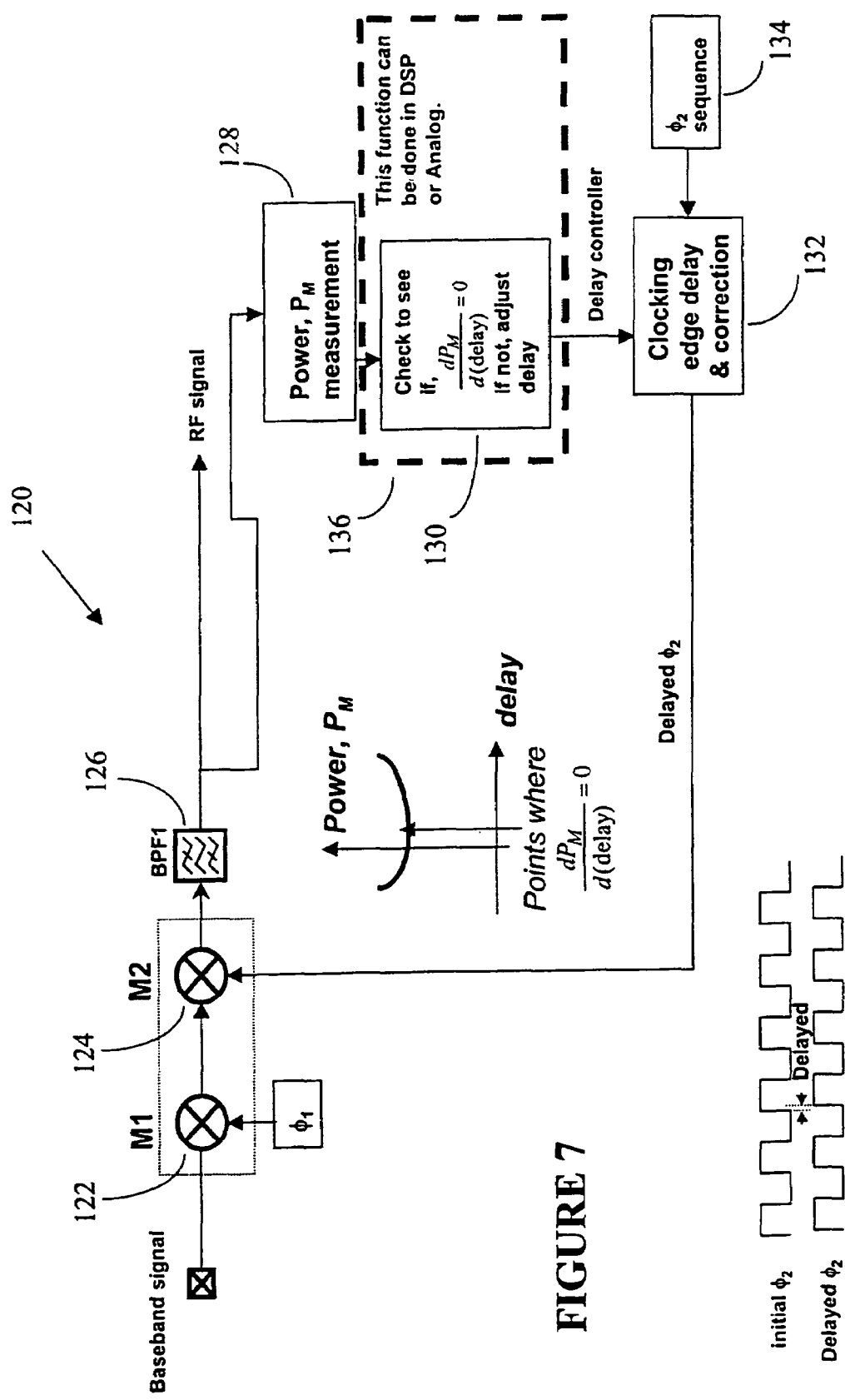
FIG. 7 presents a block diagram of an embodiment of the invention employing error correction by measuring the amount of power at baseband.

A transmitter 120 for implementing this procedure is illustrated in FIG. 7 (a more detailed description is provided in the paragraph below). The power measurement scheme and the element blocks required to detect when $$\frac{dP_M}{d\tau} = 0,$$

can be implemented within a digital signal processing unit (DSP). Also illustrated in FIG. 7 is a visual representation of the power measured versus delay, which identifies an optimum point at which $$\frac{dP_M}{d\tau} = 0.$$

In the block diagram of FIG. 7 the baseband signal is first multiplied by the signals $\phi_1$ and $\phi_2$ via mixers M1 122 and M2 124, respectively. The signal is next filtered via a band pass filter (BPF) 126, which is used to reduce the amount of out-of-band power, which may cause the subsequent elements to compress in gain or distort the wanted signal. The design of this BPF 126 depends on the bandwidth of the wanted signal, the system specifications and system design trade offs. In the interest of simplicity, separate in-phase and quadrature channels have not been identified, though the invention is preferably implement as such.

The output of the BPF 126 is the desired up-converted RF signal. This output signal is measured with power measurement unit 128. The power is minimized with respect to the delay added onto the signal $\phi_2$ by use of the $$\frac{dP_M}{d(\text{delay})} = 0$$

detector 130, and the delay controller 132 which manipulates the $\phi_2$ signal source 134. As shown in the timing diagram of FIG. 7, this process allows signal $\phi_2$ to be delayed in time.

In general, the power can be minimized with respect to the rise time of $\phi_2$ or a combination of delay and rise time. Furthermore, the power can be minimized with respect to the delay, rise time, or both delay and rise time of the signal $\phi_1$, or both $\phi_1$ and $\phi_2$. It would be clear to one skilled in the art that current or voltage may be measured rather than power in certain applications. As well, the phase delay of either or both of $\phi_1$ and $\phi_2$ may be modified to minimized the error.

It is preferred that this power detection 130 be done within a digital signal processing unit (DSP) 136 after the baseband signal is digitized via an analog to digital converter, but it may be done with separate components, or analogue components.

A problem that may prove to be more serious than aliasing power at the output, is a direct current offset accompanying the signal baseband signal x(t). Letting DC represent the value of this unknown direct current offset, the input can be written as x(t)+DC. Therefore, the output of the structure would be of the form:

$$y(t)=x(t)\times[VLO_{ij}+DC\times VLO_i] \quad (6)$$

assuming there is no error associated with the generation of the VLO signal. In this presentation, the term $DC\times VLO_i$ represents unwanted power near the wanted signal $x(t)\times VLO_i$.

Figure 8:
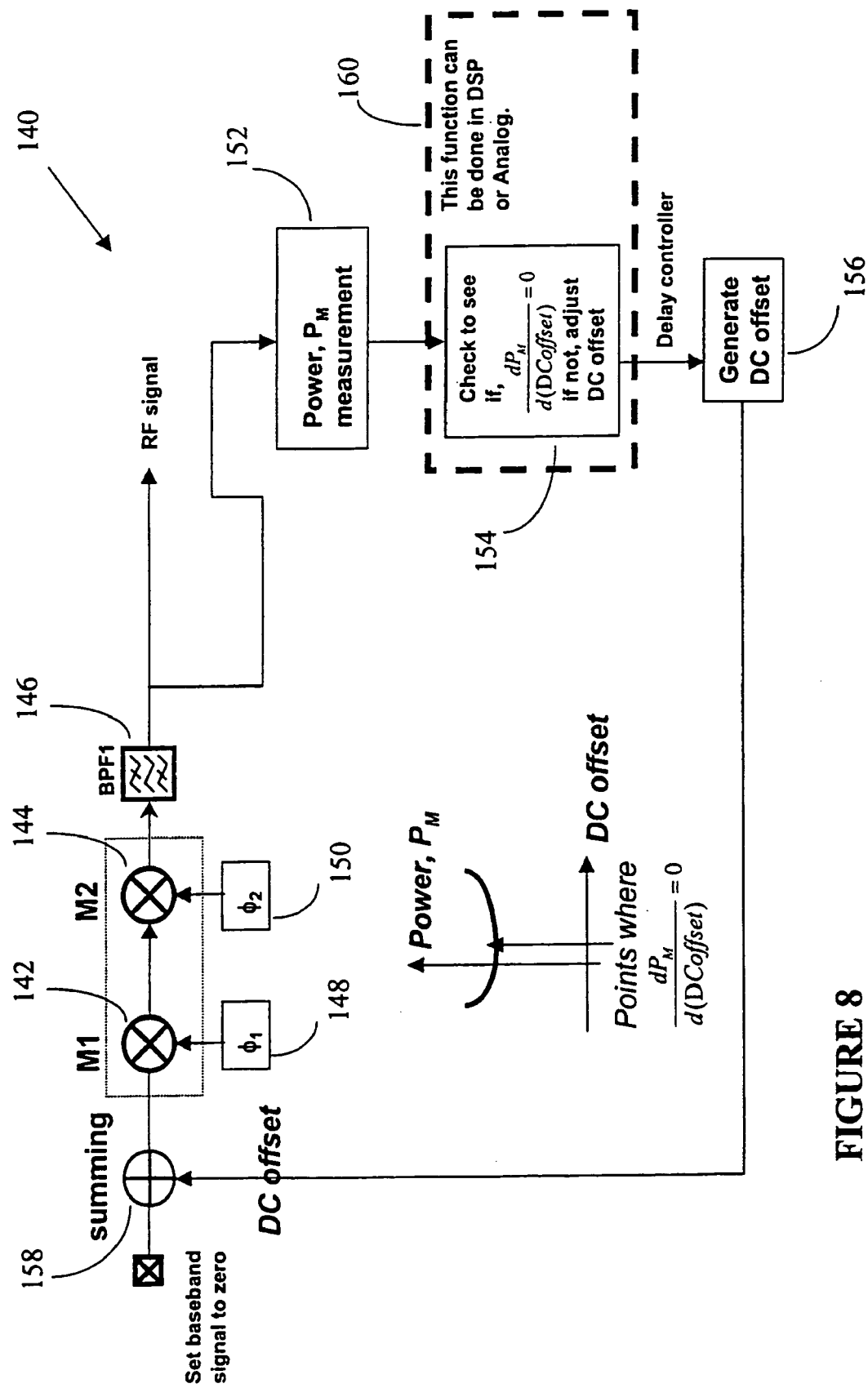
FIG. 8 presents a block diagram of a transmitter in a preferred embodiment of the invention.

One method that can be used to remove this unwanted power, $DC\times VLO_i$, is to remove the DC offset using a calibration routing as presented in FIG. 8. Briefly, the calibration routing of this transmitter 120 first sets the baseband signal to zero, then measures the output power, minimizing it against a parameter that adds an additional DC offset to the input of the structure via a summing device. The power measured can be made at any point after the two mixers, that is, it could be made at the output of a power amplifier driving the antenna.

Specifically, FIG. 8 presents a block diagram of a transmitter which produces a filtered and amplified baseband signal in generally the same manner as that of FIG. 7. Hence, components 122, 124 and 126 of FIG. 7 correspond with components 142, 144 and 146 of FIG. 8 respectively, though their input signals are slightly different.

It is preferred to generate the inputs to the two mixers 142 and 144 by me of signal generation blocks 148 and 150; signal generation block 148 generating $\phi_1$ signal and signal generation block 150 generating the $\phi_2$ signal. Implementing the invention with separate I and Q channels would require four mixers, two per channel, and four $\phi$ signals; specifically, $\phi_1 I$ and $\phi_1 Q$; and $\phi_2 I$ and $\phi_2 Q$ as shown FIG. 6.

The input to these generation blocks 148 and 150 is an oscillator which does not have a significant amount of signal power at the frequency of the desired output RF signal. The construction of the necessary logic for these components would be clear to one skilled in the art from the description herein, and in particular, with reference to FIG. 5. Such signals may be generated using basic logic gates, programmable gate arrays (FPGA), read only memories (ROMs), micro-controller or other devices known in the art. Further description and other means of generator such signals is presented in the co-pending patent application under the Patent Cooperation Treaty, Serial No. PCT/CA00/00996.

The embodiment of FIG. 8 is distinct from that of FIG. 7 with regard to the feedback control loop. Power measurement of the RF output signal is performed by the power measurement unit 152, but rather than optimising for $$\frac{dP_M}{d(\text{delay})}=0$$

per the embodiment presented in FIG. 7, the control loop is optimised for $$\frac{dP_M}{d(DCoffset)}=0$$

using detector 154, which drives the DC offset generator 156 DC offset is affected in the baseband signal by means of the summer 158 which sums the input baseband signal with the direct current offset from the DC offset generator 156. Suitable components for the DC offset generator 156 and summer 158 are known in the art.

The physical order (that is, arrangement) of the BPF 146, the DC offset correction summer 158, and any additional gain control elements (none shown) can be rearranged to some degree. Such modifications would be clear to one skilled in the art.

As in the case of FIG. 7, separate in-phase and quadrature channels have not been identified in the interest of simplicity, though the invention of FIG. 8 is preferably implement as such. As well, though the figure implies the use of analogue components, they can be implemented in digital form.

Also as in the case of FIG. 7, it is preferred that the detector 154, be embodied in a digital signal processor (DSP) 160.

Figure 9:
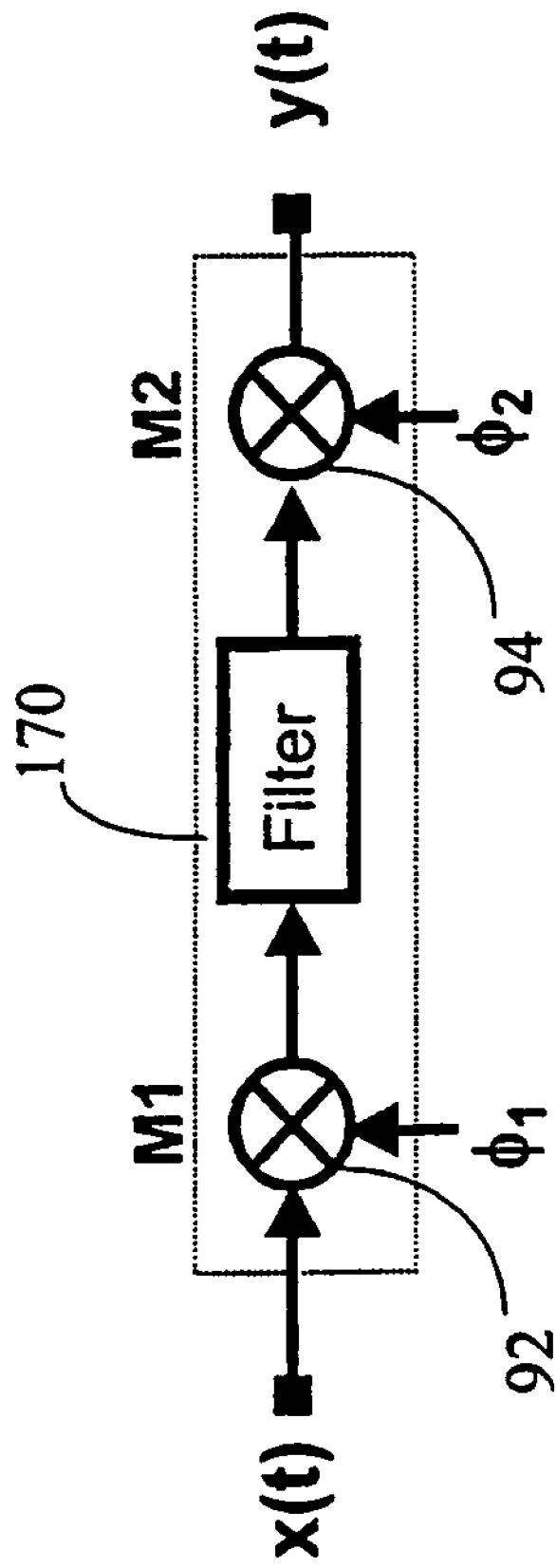
FIG. 9 presents a block diagram of an embodiment of the invention employing a filter placed between mixers M1 and M2.

It would be clear to one skilled in the art that many variations may be made to the designs presented herein, without departing from the spirit of the invention. One such variation to the basic structure in FIG. 5a is to add a filter 170 between the two mixers 92 and 94 as shown in the block diagram of FIG. 9 to remove unwanted signals that are transferred to the output port. This filter 170 may be a low pass, high pass, or band pass filter depending on the transmitter requirements. The filter 170 does not necessarily have to be a purely passive filter, that is, it can have active components.

Figure 10:
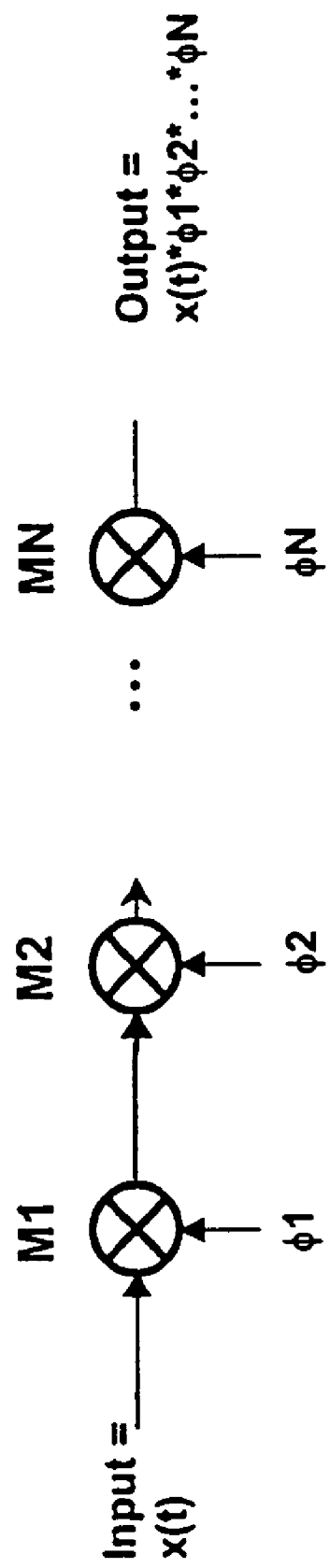
FIG. 10 presents a block diagram of an embodiment of the invention employing N mixers and N mixing signals.

Another variation is that several functions $\phi_1, \phi_2, \phi_3 \ldots \phi_n$ may be used to generate the virtual LO, as presented in the block diagram of FIG. 10. Here, $\phi_1 * \phi_2 * \ldots * \phi_n$ has a significant power level at the LO frequency, but each of the functions $\phi_1 \ldots \phi_n$ contain an insignificant power level at LO.

The electrical circuits of the invention may be described by computer software code in a simulation language, or hardware development language used to fabricate integrated circuits. This computer software code may be stored in a variety of formats on various electronic memory media including computer diskettes, CD-ROM, Random Access Memory (RAM) and Read Only Memory (ROM). As well, electronic signals representing such computer software code may also be transmitted via a communication network.

Clearly, such computer software code may also be integrated with the code of other programs, implemented as a core or subroutine by external program calls, or by other techniques known in the art.

The embodiments of the invention may be implemented on various families of integrated circuit technologies using digital signal processors (DSPs), microcontrollers, microprocessors, field programmable gate arrays (FPGAs), or discrete components. Such implementations would be clear to one skilled in the art.

The invention may be applied to various communication protocols and formats including: amplitude modulation (AM), frequency modulation (FM), frequency shift keying (FSK), phase shift keying (PSK), cellular telephone systems including analogue and digital systems such as code division multiple access (CDMA), time division multiple access (TDMA) and frequency division multiple access (FDMA).

The invention may be applied to such applications as wired communication systems include computer communication systems such as local area networks (LANs), point to point signalling, and wide area networks (WANs) such as the Internet, using electrical or optical fibre cable systems. As well, wireless communication systems may include those for public broadcasting such as AM and FM radio, and UHF and VHF television; or those for private communication such as cellular telephones, personal paging devices, wireless local loops, monitoring of homes by utility companies, cordless telephones including the digital cordless European telecommunication (DECT) standard, mobile radio systems, GSM and AMPS cellular telephones, microwave backbone networks, interconnected appliances under the Bluetooth standard, and satellite communications.

While particular embodiments of the present invention have been shown and described, it is clear that changes and modifications may be made to such embodiments without departing from the true scope and spirit of the invention.

What is claimed is:

1. A radio frequency (RF) up-convertor with reduced local oscillator leakage, for emulating the modulation of an input signal x(t) with a local oscillator signal having frequency $f$, said up-convertor comprising:
   a synthesizer for generating mixing signals $\phi_1$ and $\phi_2$ which vary irregularly over time, where:
   $\phi_1 * \phi_2$ has significant power at the frequency $f$ of said local oscillator signal being emulated;
   neither $\phi_1$ nor $\phi_2$ has significant power at the frequency $f$ of said local oscillator signal being emulated, and
   said mixing signals $\phi_1$ and $\phi_2$ are designed to emulate said local oscillator signal having frequency $f$ in a time domain analysis;
   a first mixer coupled to said synthesizer for mixing said input signal x(t) with said mixing signal $\phi_1$ to generate an output signal x(t) $\phi_1$; and
   a second mixer coupled to said synthesizer and to the output of said first mixer for mixing said signal x(t) $\phi_1$ with said mixing signal $\phi_2$ to generate an output signal x(t) $\phi_1$ $\phi_2$, said output signal x(t) $\phi_1$ $\phi_2$ emulating the modulation of said input signal x(t) with said local oscillator signal having frequency f.

2. The radio frequency (RF) up-converter of claim 1 wherein said synthesizer further comprises:
   a synthesizer for generating mixing signals $\phi_1$ and $\phi_2$, where $\phi_1 * \phi_1 * \phi_2$ does not have a significant amount of power within the bandwidth of said output signal x(t) $\phi_1 \phi_2$.

3. The radio frequency (RF) up-convertor of claim 1 wherein said synthesizer further comprises:
   a synthesizer for generating mixing signals $\phi_1$ and $\phi_2$, where $\phi_1 * \phi_2$ does not have a significant amount of power within the bandwidth of said output signal x(t) $\phi_1 \phi_2$.

4. The convertor of claim 3, further comprising:
   a closed loop error correction circuit.

5. The radio frequency (RF) up-convertor of claim 4, wherein said closed loop error correction circuit further comprises:
   an error level measurement circuit for measuring an error in said output signal x(t) $\phi_1 \phi_2$; and
   a time-varying signal modification circuit for modifying a parameter of one of said mixing signals $\phi_1$ $\phi_2$ to minimize said error level.

6. The radio frequency (RF) up-convertor of claim 5, wherein said error level measurement circuit comprises a power measurement.

7. The radio frequency (RF) up-convertor of claim 5, wherein said error level measurement circuit comprises a voltage measurement.

8. The radio frequency (RF) up-convertor of claim 5, wherein said error level measurement circuit comprises a current measurement.

9. The radio frequency (RF) up-convertor of claim 5, wherein said modified parameter is the phase delay of one of said mixing signals $\phi_1$ and $\phi_2$.

10. The radio frequency (RF) up-convertor of claim 5, wherein said modified parameter is the fall or rise time of one of said mixing signals $\phi_1$ and $\phi_2$.

11. The radio frequency (RF) up-convertor of claim 5, wherein said modified parameter includes both the phase delay and the fall or rise time of one of said mixing signals $\phi_1$ and $\phi_2$.

12. The radio frequency (RF) up-convertor of claim 4, wherein said closed loop error correction circuit comprises a digital signal processor (DSP).

13. The radio frequency (RF) up-convertor of claim 4, wherein said closed loop error correction circuit comprises analogue components.

14. The radio frequency (RF) up-convertor of claim 4, wherein said closed loop error correction circuit further comprises:
   an error level measurement circuit for measuring an error in said output signal x(t) $\phi_1$; and
   a time-varying signal modification circuit for modifying a parameter of one of said mixing signals $\phi_1$ and $\phi_2$ to minimize said error level.

15. The radio frequency (RF) up-convertor of claim 3 wherein said synthesizer further comprises:
   a synthesizer for generating mixing signals $\phi_1$ and $\phi_2$, where said mixing signals $\phi_1$ and $\phi_2$ can change with time in order to reduce errors.

16. The radio frequency (RF) up-convertor of claim 3, further comprising:
   a DC offset correction circuit.

17. The radio frequency (RF) up-convertor of claim 16, wherein said DC offset correction circuit comprises:
   a DC offset generating circuit for generating a DC offset voltage;
   a summer for adding said DC offset voltage to an output of one of said mixers; and
   a DC error level measurement circuit for modifying the level of said DC offset voltage to minimize error level.

18. The radio frequency (RF) up-convertor of claim 17, wherein said DC error level measurement circuit comprises a power measurement circuit.

19. The radio frequency (RF) up-convertor of claim 17, wherein said DC error level measurement circuit comprises a voltage measurement circuit.

20. The radio frequency (RF) up-convertor of claim 17, wherein said DC error level measurement circuit comprises a current measurement circuit.

21. The radio frequency (RF) up-convertor of claim 3, further comprising:
   a local oscillator coupled to said synthesizer for providing a periodic signal having a frequency that is an integral multiple of the frequency of said local oscillator signal being emulated.

22. The radio frequency (RF) up-convertor of claim 1, further comprising: a filter for removing unwanted signal components.

23. The radio frequency (RF) up-convertor of claim 22, where said filter comprises:
   a filter for removing unwanted signal components from said x(t) $\phi_1$ signal.

24. The radio frequency RF up-converter of claim 1, wherein said mixing signal is a square wave.

25. The radio frequency (RF) up-convertor of claim 1, wherein said mixing signals $\phi_1$ and $\phi_2$ effect the modulation of an in-phase component of said input signal x(t), and a complementary up-convertor with mixing signals 90 degrees out of phase, is used to effect the modulation of a quadrature component of said input signal x(t).

26. The radio frequency (RF) up-convertor of claim 1, wherein said synthesizer uses a single time base to generate both mixing signals $\phi_1$ and $\phi_2$.

27. The radio frequency (RF) up-convertor of claim 1, wherein said mixing signals $\phi_1$ and $\phi_2$ are digital waveforms.

28. The radio frequency (RF) up-convertor of claim 1, wherein said mixing signals $\phi_1$ and $\phi_2$ are square waveforms.

29. The radio frequency (RF) up-convertor of claim 1, where said synthesizer uses different patterns to generate signals $\phi_1$ and $\phi_2$.

30. An integrated circuit comprising the radio frequency (RF) up-convertor of claim 1.

31. A method of modulating a baseband signal x(t) comprising the steps of:
generating mixing signals $\phi_1$ and $\phi_2$ which vary irregularly over time, where:
$\phi_1 * \phi_2$ has significant power at the frequency $f$ of a local oscillator signal being emulated;
neither $\phi_1$ nor $\phi_2$ has significant power at the frequency $f$ of said local oscillator signal being emulated, and
said mixing signals $\phi_1$ and $\phi_2$ are designed to emulate said local oscillator signal having frequency f, in a time domain analysis;
mixing said input signal x(t) with said mixing signal $\phi_1$ to generate an output signal x(t) $\phi_1$; and
mixing said signal x(t) $\phi_1$ with said mixing signal $\phi_2$ to generate an output signal x(t) $\phi_1$ $\phi_2$.

* * * * *